United States Patent
Sementchenko

[11] Patent Number: 6,144,204
[45] Date of Patent: Nov. 7, 2000

[54] GRADIENT COILS FOR MAGNETIC RESONANCE MEETING

[75] Inventor: Mikhail G. Sementchenko, St. Petersburg, Russian Federation

[73] Assignee: Picker Nordstar Oy, Finland

[21] Appl. No.: 09/200,405

[22] Filed: Nov. 28, 1998

Related U.S. Application Data

[60] Provisional application No. 60/065,972, Nov. 28, 1997.

[51] Int. Cl.[7] .................................................... G01V 3/00
[52] U.S. Cl. ............................................ 324/318; 324/322
[58] Field of Search ................................... 324/318, 319, 324/320, 321, 322, 307, 309

[56] References Cited

U.S. PATENT DOCUMENTS

| | | | |
|---|---|---|---|
| 4,728,895 | 3/1988 | Briguet et al. | 324/318 |
| 5,296,810 | 3/1994 | Morich | 324/318 |
| 5,555,251 | 9/1996 | Kinanen | 324/319 |
| 5,581,187 | 12/1996 | Pausch | 324/318 |
| 5,760,582 | 6/1998 | Morrone | 324/322 |
| 5,942,898 | 8/1999 | Petropoulos et al. | 324/320 |

*Primary Examiner*—Louis Arana
*Attorney, Agent, or Firm*—Timothy B. Gurin; John J. Fry

[57] ABSTRACT

Shielded gradient coils are adapted for use in an MR imaging apparatus having spaced apart pole pieces. The x, y, and z coils each include a active and shield layers. The x-active and shield layers are interconnected by a plurality of vertical electrical connections extending around the periphery of the coil. The y-active and shield layers are similarly connected. The z-active and shield layers each have a generally spiral conductor pattern.

19 Claims, 8 Drawing Sheets

GRADIENT COILS FOR MAGNETIC RESONANCE MEETING

The present application claims priority to U.S. Provisional Application Ser. No. 60/065,972 filed Nov. 28, 1997.

BACKGROUND

The present invention relates to the field of magnetic resonance imaging. It finds particular application in conjunction with gradient coils for use therein.

Magnetic resonance imaging (MRI) is a widely used diagnostic imaging method. MRI equipment includes a magnet apparatus for generating a very strong, homogeneous static magnetic field. A so-called "open" magnet arrangement includes a pair of pole pieces disposed on opposite sides of an imaging region. Because it is necessary to impose a series of rapidly varying gradient magnetic fields on the static magnetic field, MRI systems typically include a set of gradient coils disposed between the pole pieces and the imaging region to generate the requisite gradients, usually in orthogonal x, y, and z directions.

Unfortunately, the time varying gradient fields induce eddy currents in electrically conductive materials, such as the magnet pole pieces, in the vicinity of the gradient coils. These eddy currents have various deleterious effects, most notably opposing rapid variations in the gradient magnetic fields. The interactions between the gradient magnetic flux and the iron pole pieces can cause field transients during changes in the gradients. The eddy currents also create a non-homogeneous magnetic field which decays with a relatively long time constant, for example on the order of hundreds of milliseconds. These effects lead to worsened image quality and can make imaging using relatively rapid sequences difficult, if not impossible.

Various attempts have been made to overcome these effects. In a so-called passive shielding technique, materials having desirable magnetic properties have been placed on the surface of the pole piece so as to attenuate the magnetic flux coupled to the bulk iron of the pole pieces. However, it is difficult to find materials having suitable properties, particularly at higher fields strengths. Because the magnetic flux generated by the gradients tends to penetrate deeply into the pole piece, the material needs to be relatively thick. Further, this approach decreases the undesirable effects but does not eliminate them completely.

Another technique involves electronic compensation of eddy current effects. Due to the complexity of the various interactions between the gradient fields and the pole pieces, effective compensation is difficult. Moreover, this technique does not account for gradient induced heating of the pole pieces.

Still another technique is disclosed in U.S. Pat. No. 5,555,251, entitled Arrangement to Minimize Eddy Currents in MR Imagers, which is commonly assigned with the present application. The disclosed technique includes uses a series of electrically insulated layers. A series of slots further reduces the eddy currents in the layers. While this technique has proven effective in reducing eddy current effects, further improvement is nonetheless desirable.

SUMMARY

The present invention addresses these issues, and others.

According to a first aspect of the present invention, an apparatus for use in magnetic resonance imaging includes first and second pole pieces disposed on opposite sides of an examination region and a generally planar first gradient coil for generating a first gradient magnetic field within the examination region. The first gradient coil includes and active layer and a shield layer. The shield layer is disposed between the active layer and the first pole piece. The active and shield layers are electrically connected at a plurality of locations along the outer perimeter of the gradient coil.

According to a more limited aspect of the present invention, the active and shield layers are electrically connected so as to form a squirrel cage structure.

According to another more limited aspect, the average current in the plane of the gradient coil along the outer perimeter of the gradient coil is substantially zero. According to a yet more limited aspect, the active layer includes first and second active layers which are substantially mirror images of each other. According to a yet more limited aspect, the shield layer includes first and second shield layers which are substantially mirror images of each other. According to another more limited aspect of the present invention, the active and shield layers each include a plurality of generally planar conductors. The conductors have slits extending therethrough, whereby eddy currents generated by magnetic flux having a component perpendicular to the plane of the gradient coil are reduced.

According to another limited aspect of the present invention, the apparatus further includes a generally planar second gradient coil for generating a second gradient magnetic field in a direction orthogonal to the main magnetic field. The second gradient coil includes and active layer and a shield layer. The active and shield layers are electrically connected at a plurality of locations along the outer perimeter of the gradient coil.

Still other aspects and objects of the present invention will be recognized by those skilled in the art upon reading and understanding the appended description.

DRAWINGS

DESCRIPTION

Figure 1:
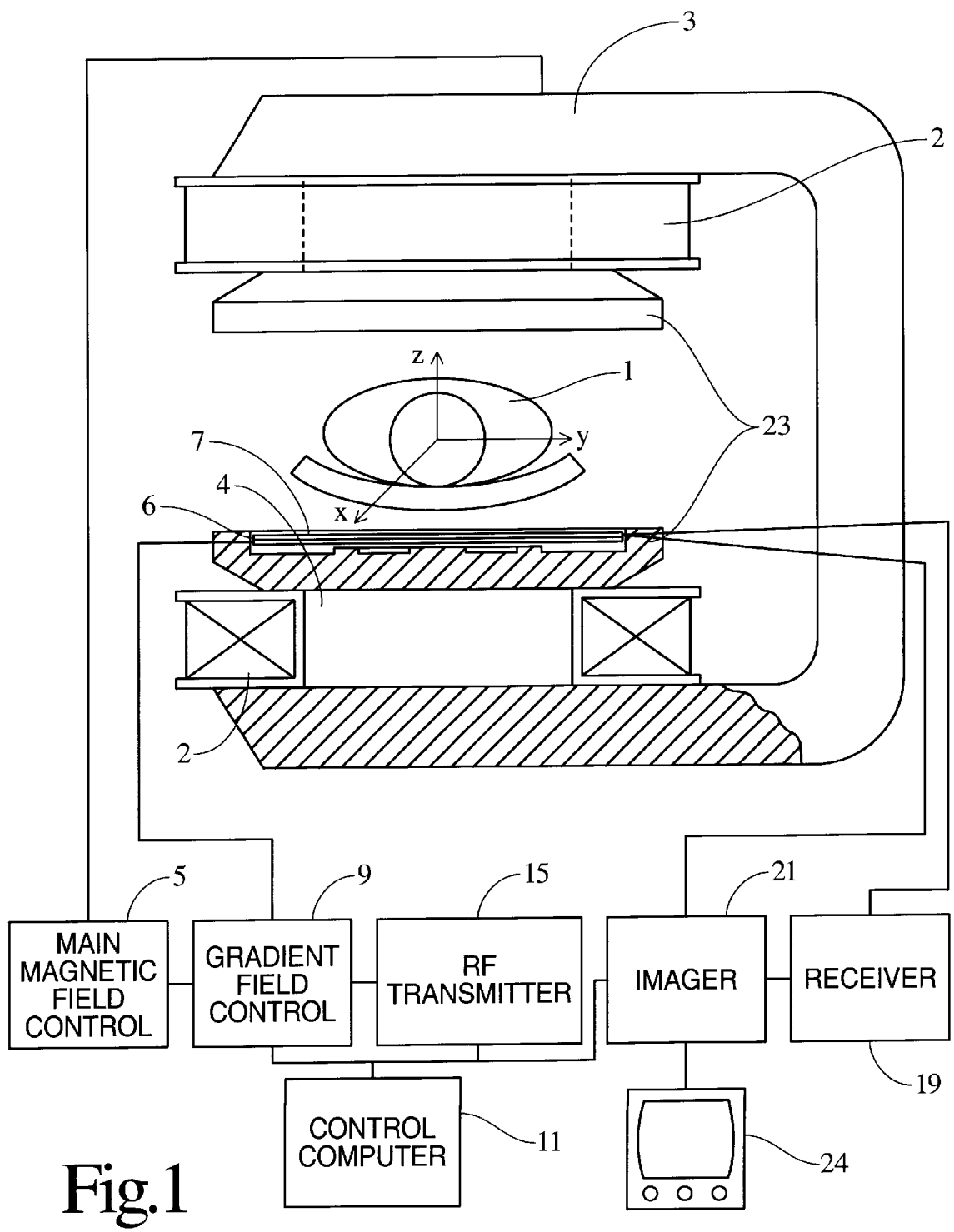
FIG. 1 depicts a magnetic resonance imaging apparatus according to the present invention.

With reference to FIG. 1, an MRI apparatus which produces images of the anatomy of patient 1 includes a generally c-shaped magnet body 3. The patient 1 is placed in an imaging region located between a pair of opposed pole pieces 23. A main magnetic field control 5 supplies energizing current to the driver coils 2 associated with each pole so as to generate the main magnetic field Bo in the z direction. Necks 4 connect the pole pieces 23 to the body 3 of the magnet, thereby providing a return path through the body of the magnet.

Gradient coil assemblies 6 located between each pole piece 23 and the imaging region generate time-varying gradient magnetic fields, preferably in three orthogonal directions (e.g., x, y, z). While only the lower gradient coil assembly 6 is shown in FIG. 1, it will be appreciated that a second gradient coil assembly is similarly located in relation to the upper pole piece such that the coils are positioned symmetrically with respect to the imaging volume. Stated another way, the upper and lower coil assemblies are symmetrical with respect to reflection in the z=0 plane.

The gradient coil assemblies 6 are substantially planar and are positioned so as to lie in the x-y plane (e.g., normal to the main magnetic field Bo). The respective gradient coils are energized by a gradient field controller 9 which contains a gradient field amplifier associated with each coil. The gradient controller 9 is in turn controlled by a computer 11 to generate time varying gradient sequences necessary to carry out a desired magnetic resonance excitation and detection sequence.

The apparatus also includes an r.f. coil system 7 which includes a transmitting and a receiving coil arrangement. While only the lower r.f. system 7 is shown, it will be appreciated that a second set of r.f. coils is similarly located in relation to the upper pole piece such that the coils are positioned symmetrically with respect to the imaging volume. The coil 7 is energized by r.f. transmitter 15 under control of the computer 11 to apply an r.f. field. The r.f. coil system 7 also includes an r.f. receiving coil arrangement arranged to detect r.f. signals resulting from magnetic resonance excited in the body of the patient 1. The detected signals are passed via a receiver 19 to an imager 21 which, under control of the computer 11, processes the signal to produce an image representative of the patient's body. These signals are, in turn, passed to display device 24 to provide a human-readable display of the image.

In operation of the apparatus, the strong magnetic field provided by the magnet defines an equilibrium axis of magnetic alignment in the body of the patient 1. To obtain an image of a selected region, e.g. a cross-sectional slice of the body, an r.f. field pulse is first applied to the patient 1 using coil system 7 to excite magnetic resonance in the selected region. To this end, the coil system 13 produces a field in a direction orthogonal to the static field direction so as to tip the spins of nuclei in the selected region from the direction of the static field. To restrict excitation to a desired region, the r.f. field pulse is applied in conjunction with magnetic field gradients imposed by the coil arrangement 6, the frequency of the r.f. field being chosen in conjunction with the magnitudes and directions of the imposed gradients so that the Larmor frequency protons in the body, e.g. hydrogen protons, is equal to the r.f. field frequency only in the desired region.

The r.f. signals resulting from excitation are then spatially encoded by application of one or more further gradient magnetic fields in known manner, detected by the r.f. coil system 13, and processed to produce a human-readable image, for example on monitor 24. Normally, a number of excitation and signal detection sequences are required to collect sufficient data to produce a satisfactory image.

Figure 2:
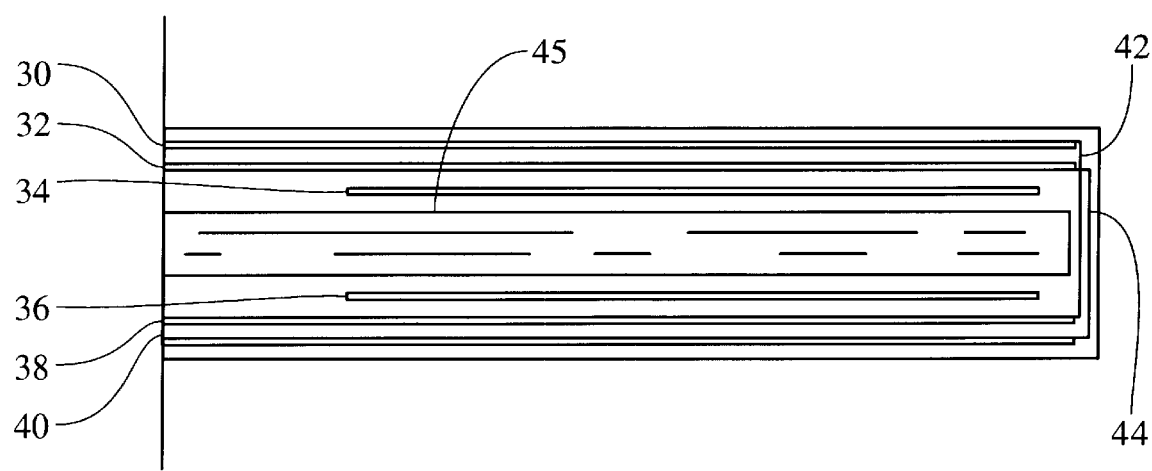
FIG. 2 is a side view which depicts the various layers of a gradient coil assembly.

Each gradient coil assembly 6 includes coils for generating gradients in the x, y, and z directions. With reference to FIG. 2, a y-axis shield coil 30 is disposed nearest the pole piece, followed by an x-axis shield coil 32, a z-axis shield coil 34, a z-axis active coil 36, a y-axis active coil 38, and an x-axis active coil 40. A series of electrically insulating dielectric layers (not shown) separates the coil layers.

Various of the conductors of the of the x-axis shield coil 32 are connected to conductors of the x-axis active coil 40 by vertical electrical connections represented schematically at 44 to form a squirrel cage structure. Similar vertical electrical connections represented schematically at 42 connect various of the conductors of the y-axis shield coil 30 with conductors of the y-axis active coil 38. A cooling layer 45 is disposed between the z-axis shield 34 and the z-axis active 36 coils so as to provide cooling for the gradient coil assembly 6. The z-axis shield 34 and active 36 coils are connected in series external to the assembly 6 such that they are driven in series by the gradient amplifier.

Figure 3:
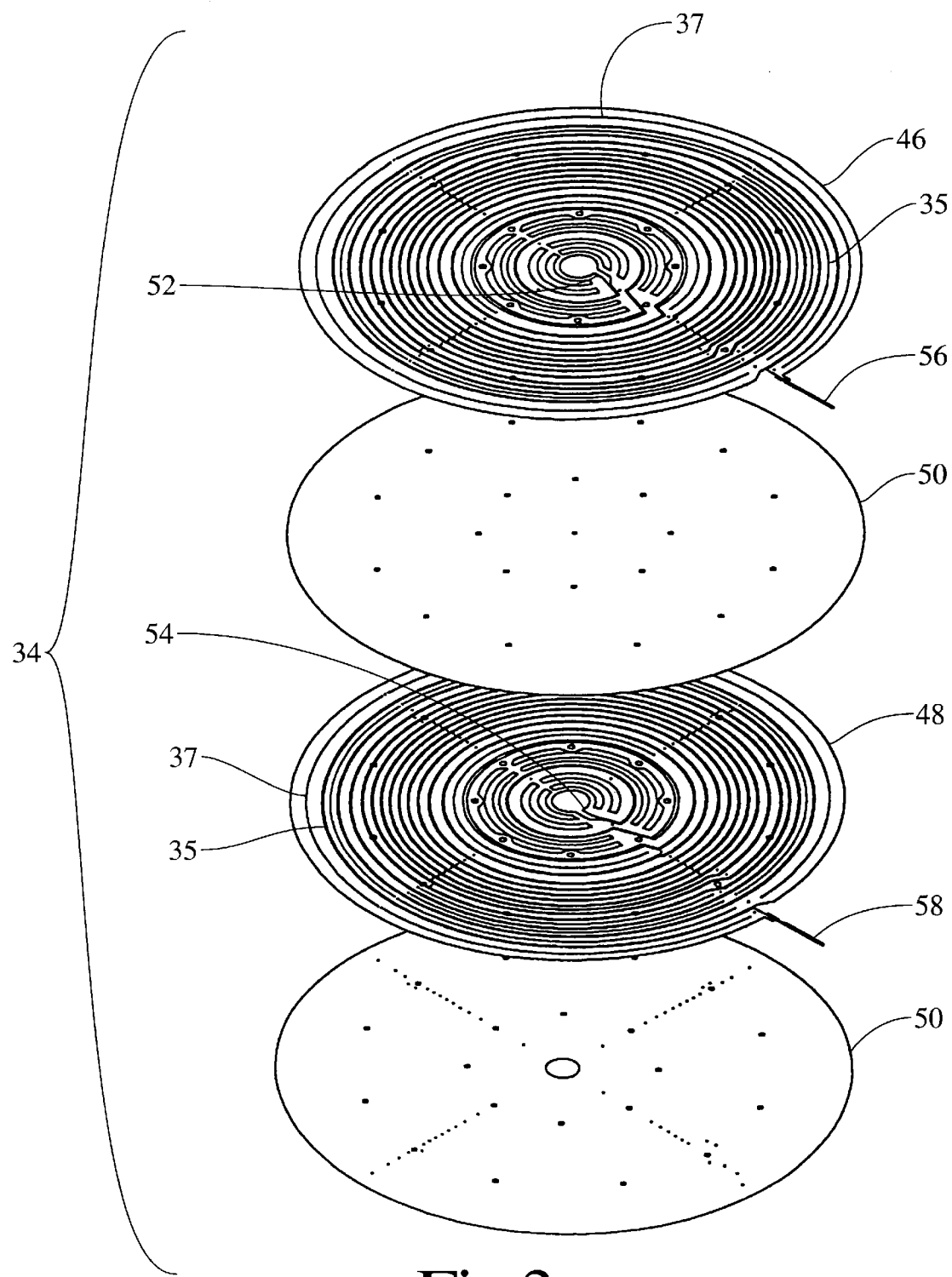
FIG. 3 is an exploded view of a z-axis shield coil.
Figure 4:
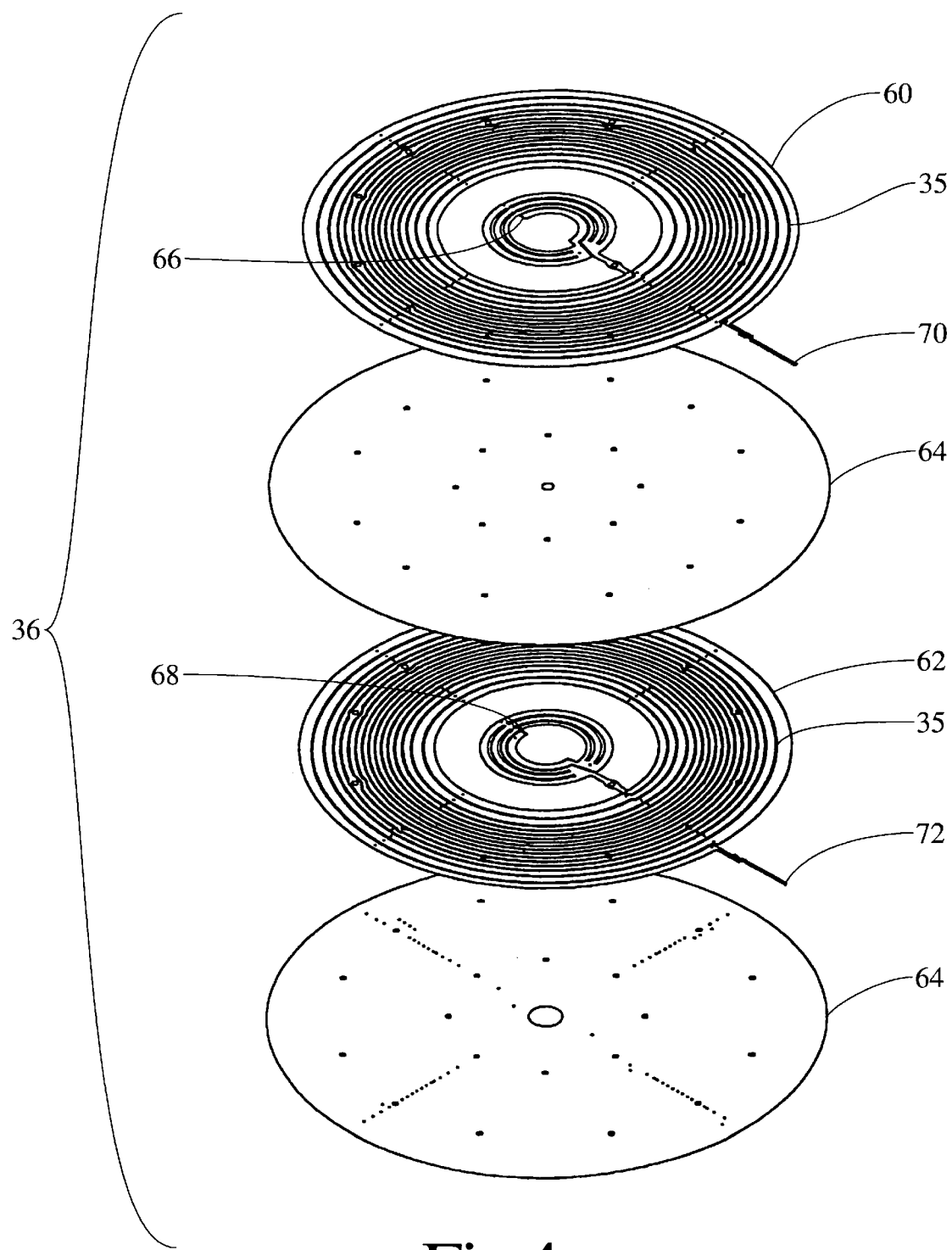
FIG. 4 is an exploded view of a z-axis active coil.

With reference to FIGS. 3 and 4, the z-axis shield 34 and the z-axis active 36 coils each include two layers 46, 48 and 60, 62, respectively. Each layer is fabricated from a copper plate having a thickness of 2 mm. The plates each have a spiral gap 35 formed therein such that each layer forms a flat spiral winding. The plates also have slits 37 which are about 1 mm in width through the copper plate. The slits extend in the direction of current flow so as to reduce eddy currents within the coil generated by flux having a component perpendicular to the plane of the coil.

With reference to FIG. 3, the z-axis shield coil 34 includes first 46 and second 48 layers, the first layer 46 being disposed nearer to the pole piece. Non-conductive dielectric layers 50 separate the coil layers 46, 48. The interior end 52 of the first spiral coil layer 46 is welded to the interior end 54 of the second spiral layer 48 through an aperture in the insulating layer so that the layers 46, 48 form a continuous spiral coil. The z-axis shield coil is driven through electrical connections at connectors 56, 58.

The first 46 and second 48 layers are substantially identical, the second shield layer 48 being "flipped" with respect to the first layer 46 about the x-axis so that the layers are mirror images of each other. A particular advantage of this configuration is that undesirable radial current components are substantially canceled. Current is, for example, introduced at the outer edge of the first layer 46 at connection point 56. Viewed from the perspective of FIG. 3, this current flows in a counterclockwise direction toward the center of the first layer 46 where the coil is connected to the second layer 48. There, the current continues to flow in a counterclockwise direction, but toward the outer edge of the second layer 48 and connection point 58. Because the radial components of the currents in the first 46 and second 48 layers are equal and opposite, the undesirable radial current component is effectively canceled.

As shown in FIG. 4, z-axis active coil 36 includes first 60 and second 62 layers, the first layer 60 being disposed nearer the pole piece. As with the shield coil 34, the first 60 and second 62 active layers are substantially identical. The second active layer 62 is "flipped" with respect to the first layer 60 about the x-axis so that the layers are mirror images of each other. Non-conductive dielectric layers 64 separate the coil layers 60, 62. Tab 66 at the interior of spiral coil layer 60 is welded to tab 68 at the interior of spiral layer 62 through an aperture in the insulation layer so that the layers 60, 62 form a continuous spiral coil. The z-axis active coil 36 is driven through electrical connections at tabs 70, 72. As with the z-axis shield coil 34, the undesirable radial current components are substantially canceled.

Figure 5:
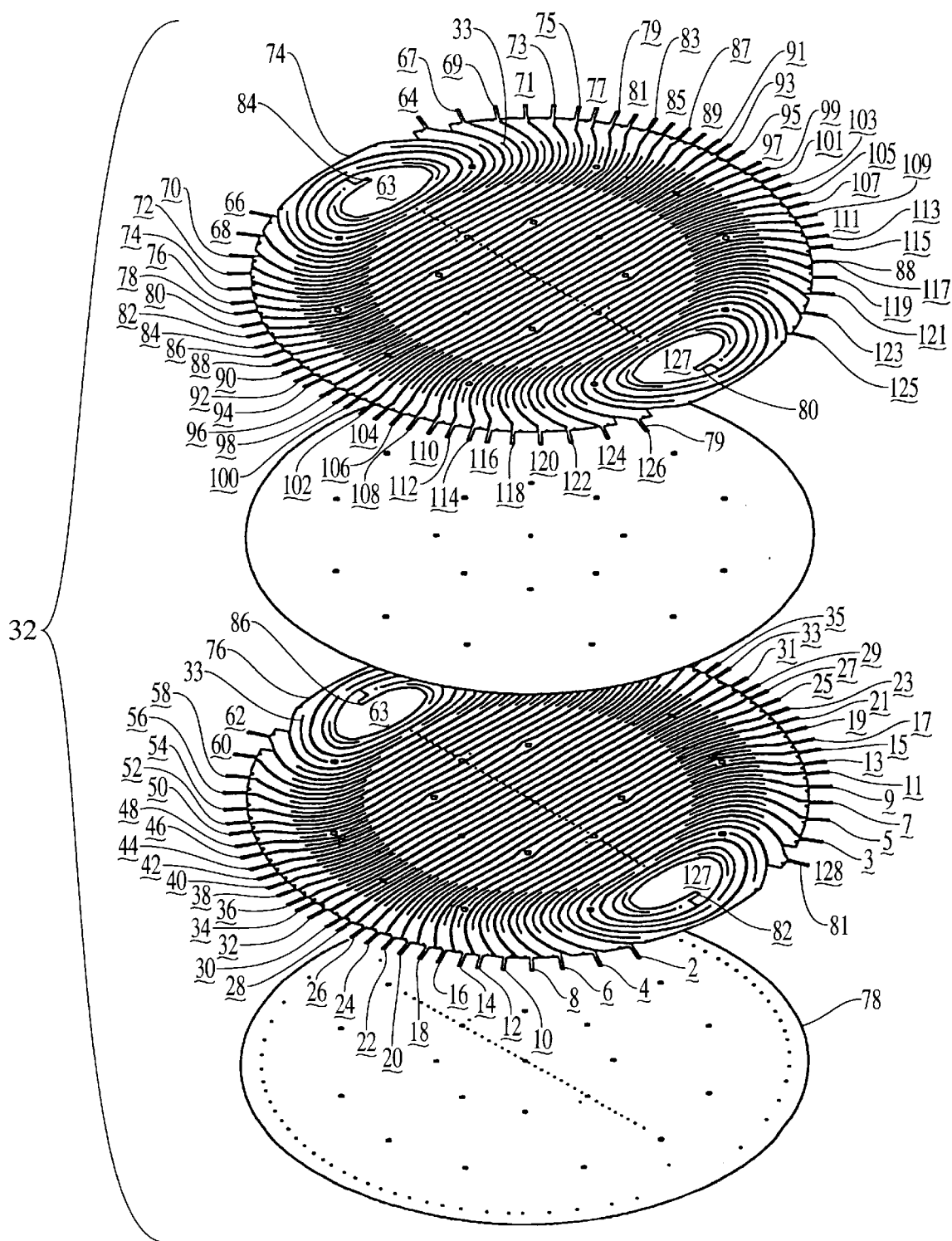
FIG. 5 is an exploded view of an x-axis shield coil.

As shown in FIG. 5, the x-axis shield coil 32 includes first 74 and second 76 coil layers, the first layer 74 being disposed nearer to the pole piece. Each coil layer is fabricated from copper plate having a thickness of 2 mm to form a plurality of conductors. The conductors also have slits 33 which are about 1 mm in width through the copper plate and extending in the direction of current flow. The slits are located in regions having a relatively vertical flux component so as to reduce eddy currents within the coil generated by flux having a component perpendicular to the plane of the coil.

Non-conductive layers 78 separate the layers 74, 76. The second shield layer 76 is "flipped" with respect to the first layer 74 about the x-axis so that the layers are substantially mirror images of each other. Tab 80 on first layer 74 is welded to tab 82 on the second layer 76 through an aperture in the insulation layer 78. Tab 84 on first layer 74 is likewise welded to tab 86 on the second layer 76.

An advantage of this configuration is that undesirable current components, especially those in a direction perpendicular to the desired current flow, may be substantially canceled. Current is, for example, introduced into a conductor in a spiral region of the first shield coil 74 at connection point 79. Viewed from the perspective of FIG. 5, this current flows in a clockwise direction toward the center of the spiral region and connection point 80 where the conductor in the first shield layer 74 is connected to a conductor in the second shield layer 76 at connection point 82. There, the current continues to flow in a clockwise direction, but toward the outer edge of the layer 76 and connection point 81. Because undesirable current components in the first 74 and second 76 layers are equal and opposite, these components are effectively canceled. These interconnections also allow the four layers of the x-axis gradient coil to be configured as a squirrel cage having one input and one output terminal.

A plurality of electrical connections 88 such as tabs or fingers is disposed around the outer circumference of the first 74 and second 78 layers. As described more fully below, these connections 88 allow conductors in the various layers of the x-axis coil to be connected in series.

Figure 6:
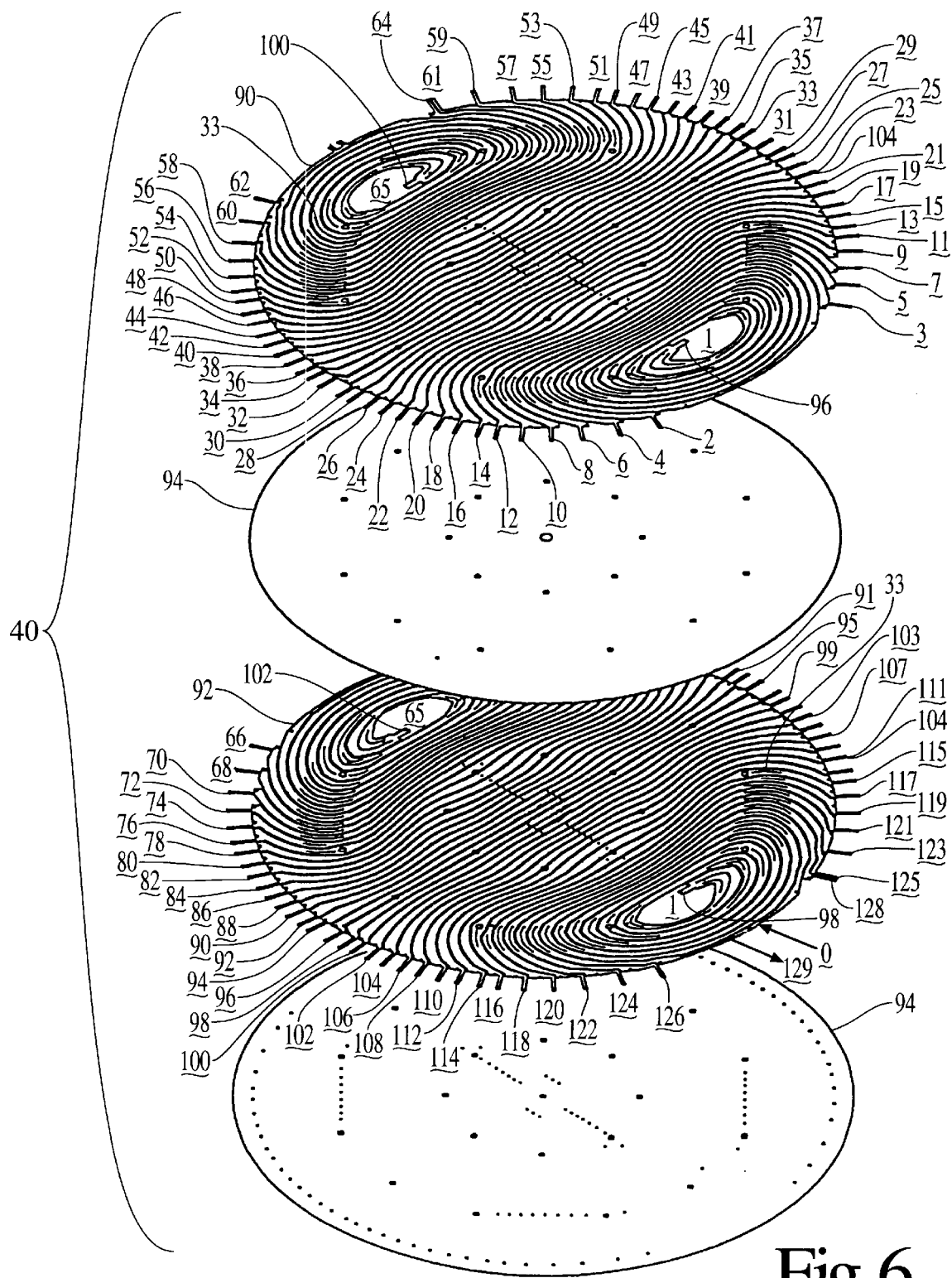
FIG. 6 is an exploded view of an x-axis active coil.

As shown in FIG. 6, the x-axis active coil 40 includes first 90 and second 92 layers, the first 90 layer being disposed nearer to the pole piece. Each layer is fabricated from copper plate having a thickness of 2 mm to form a plurality of conductors. The plates also have slits 33 which are about 1 mm in width through the conductors. The slits extend in the direction of current flow and so as to reduce eddy currents within the coil generated by flux having a component perpendicular to the plane of the coil.

The second active layer 62 is "flipped" with respect to the first layer 60 about the x-axis so that the layers are mirror images of each other. Non-conductive dielectric layers 94 separate the coil layers 90, 92. Tab 96 on first layer 90 is welded to tab 98 on the second layer 92 through an aperture in the insulation layer 94. Tab 100 on first layer 90 is likewise welded to tab 102 on the second layer 92. As with the like connections on the shield coil, these connections allow undesirable current components to be effectively canceled.

A plurality of electrical connections 104 such as fingers or tabs is disposed around the outer circumference of the first 90 and second 92 layers.

The fingers 104 and 88 on the x-axis shield coil 32 layers and the x-axis active coil 40, respectively, provide the vertical electrical connections shown schematically at 44 of FIG. 2. The fingers are located so that, when the gradient coil is assemblies, corresponding fingers are located at the same angular position about the circumference of the coil. The fingers are preferably bent over and welded together to provide the necessary interconnections between the layers. Other suitable methods such as individual wires, conductors, or the like may also be utilized. Preferably, the average current in the x,y direction around the circumference of the coil should be substantially zero.

Figure 8:
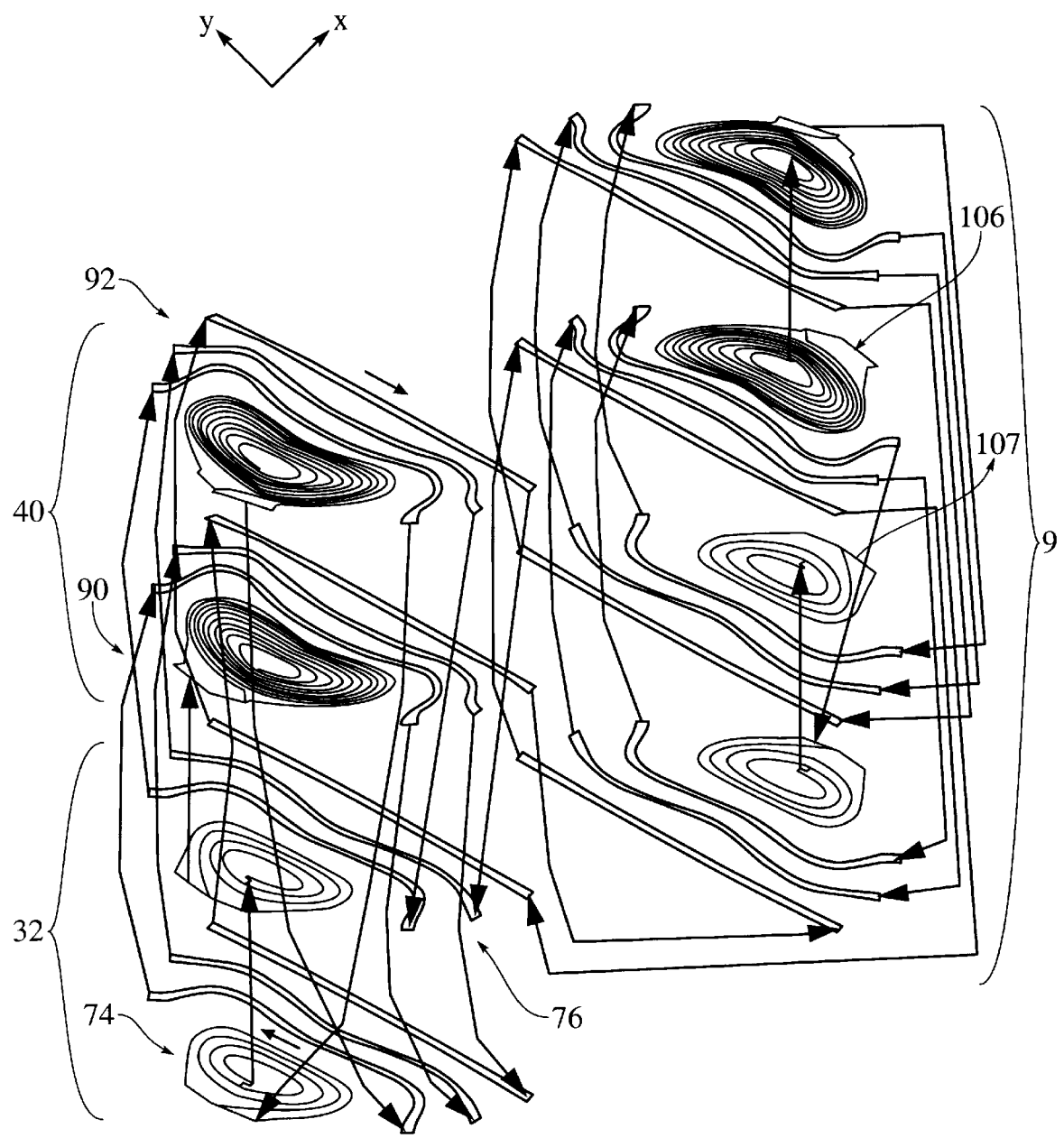
FIG. 8 depicts the vertical interconnections between the active and shield layers of an x-axis gradient coil.

FIG. 8 illustrates the various interconnections between the various layers of the x-axis active 40 and x-axis shield 32 coils. For ease of illustration, the coils are shown separated in an exploded fashion. Current is applied to the x-axis shield coil assembly 9 through electrical connections illustrated at 106 and 107. As noted above, the layers are interconnected to form a squirrel cage structure having a single pair of electrical connections 106, 107. As will be appreciated, the interconnections scheme is applicable to coils having any number of conductors.

Returning now to FIGS. 5 and 6, the preferred interconnections between the x-axis shield 32 and active 40 layers depicted therein will be described in greater detail. The various connection points are designated with underlined reference numerals (e.g., 1, 2, 3, 4, . . . ). Like numbered connection points are connected together. Thus, for example, connection point 2 on the second shield layer 76 is electrically connected to connection point 2 on the first active layer 90, connection point 118 on the second active layer 92 is electrically connected to connection point 118 on the first shield layer 74, and so on.

Electrical connections to the gradient power source may advantageously provided at connection points 0 and 129 on the second active layer 92, it being understood that a break in the coil prevents a direct electrical connection between these two points. Current entering the coil at point 0 may be visualized as proceeding through the coil to point 1, then to point 2, then to point 3, and so on in sequence, until exiting at point 129.

As will be appreciated, within each layer 74, 76, 90, 92, current in the central conductors runs in the same direction. Current in the central conductors of the active layers 90, 92 likewise runs in the same direction. Similarly, current in the central conductors of the shield layers 74, 76 runs in the same direction, although this direction is opposite to that in the active layers 90, 92.

It will also be appreciated that the squirrel cage connections in each of the active layers are connected by vertical connections to the squirrel cage connections in a corresponding shield layer. Thus, for example, the first active layer 90 is connected to the second shield layer 76 at points 2 through 62. Similarly, the second active layer 92 is connected to the first shield layer 74 at points 64 through 126.

The current in the vertical connections between the first active layer 90 and the second shield layer 76 and between the second active layer 92 and the first shield layer 74 runs in the same direction. Hence, it is not necessary that the vertical component of the current be canceled. At the same time, the horizontal components of the current in the vertical connections between the first active layer 90 and the second shield layer 76 and between the second active layer 92 and the first shield layer 74 are in opposite directions. Hence, the horizontal components of the current are cancelled.

While the foregoing discussion has focused on the x coil, it is of course equally applicable to the y coil as well.

The vertical interconnections prevent the return flux from extending beyond the edges of the coils. In particular, the vertical wires connect respective wires in the active and shield coils such that the sum of the current in the x, y plane (i.e. the horizontal component of the current) at each position x, y along the outer circumference of the coils is as close to zero as possible:

$$\sum_{n=1}^{p} \vec{i}_n(x, y) = 0$$

where p is the total number of x-active and x-shield layers.

The operational characteristics of the gradient coil system are dependent on a number of interdependent variables. In particular, it is desirable that the slope of the magnetic field gradient be constant over the imaging region. For example, the x-gradient field should obey the relationship:

$$\frac{dB_x}{dx} = k$$

where k is a constant equal to the desired gradient field strength.

In order to minimize the power requirements of the gradient amplifier and maximize the gradient slew rate, it is also desirable that the energy stored in the gradient coils be as low as possible. Stated another way, it is desirable that the inductance of the gradient coils be as low as possible.

Maximum shielding performance requires that the scattered flux density Bs which couples to the iron of the pole piece should be as low as possible. Thus, $$B_s \rightarrow 0$$

It will be appreciated, however, that a practical coil represents a compromise between these requirements. For example, the shield coil is configured to cause the return flux to run between the active and shield coils. Of course, current in the conductors of the shield coil influences the gradient field inside the imaging volume. This effect may be corrected by the configuration of the conductors in the active layer. These corrections in turn cause leakage of flux into the pole pieces. In order to compensate for this leakage, the configuration of the shield coil should be changed, and so on.

Similarly, increasing the shielding effectiveness causes an increase in flux density in certain of the regions between the layers as well as on the imaging volume side of the coil. This increases coil inductance. Improving the gradient field linearity inside the imaging volume requires modification of the shape of the conductors (especially in the active layers) in such a way to increase the coil inductance.

Hence, the configuration of the coil is preferably optimized using a numerical optimization procedure. In order to reduce the complexity of the optimization and to remove undesirable spherical harmonics from the gradient field decomposition, the shape of all conductors in the active or shield layers is expressed via current distribution function V(r), where r is the radius of a point on a layer.

The function V(r) describes the conductors as follows. The boundary between two neighboring conductors is the plurality of points which satisfies the expression $$U(r, \phi) = V(r) \cdot \cos(m(\phi)$$

where m=0 for the z coil and 1 for the x-coil, and φ is the angular position about the x, y plane.

A numerical optimization is utilized to determine the function V(r) using the cost function:

$$C(V_a, V_s) = a_L C_L(V_a, V_s) + a_S C_s(V_a, V_s) + a_E E(V_a, V_s)$$

where
$V_a$ is the current distribution function in the active layer; and $V_s$ is the current distribution function in the shield layer.

$C_L(V_a, V_s)$ is a cost function component related to the gradient field non-linearity inside the imaging volume, $C_S(V_a, V_s)$ is a cost function component related to the scattered flux touching the pole piece, and $E(V_a, V_s)$ is the total magnetic energy. Coefficients $a_L$, $a_S$, and $a_E$ define the relative importance of each of the terms in the cost function.

The cost function components $C_L(V_a, V_s)$ is defined as follows:

$$C_L(V_a, V_s) = \sum_{i=1}^{m} (B_z(R\cos(\alpha_i), R\sin(\alpha_i)) - B_I)^2$$

where
$B_I = G_z R \sin(\alpha_i)$ for the z gradient;
$B_I = G_x R \cos(\alpha_i)$ for the x gradient;
$G_z$ and $G_x$ are the required gradient strengths;
R is the radius of the imaging volume; and
α is a set of m angles between 0 and $$\frac{\pi}{2}$$

distributed evenly or almost evenly.

The cost function component $C_s(V_a, V_s)$ is defined as follows:

$$C_S(V_a, V_s) = \sum_{i=0}^{n} B(\rho_i)^2$$

where $\rho_i$ is a set of n points located on the surface of the pole piece along the x-axis. These points are distributed evenly or almost evenly.

The calculation may be made using conventional finite element software or other similar computational method. The same software may also be used to compute the total magnetic energy. The values of $C_L(V_a, V_s)$ and $C_S(V_a, V_s)$ are evaluated by direct computation of the flux densities at n+m points created by the current distribution described by functions $V_a$ and $V_s$. Suitable values for the coefficients $a_L$, $a_S$, and $a_E$ are, for example, as follows:

|       | x and y gradient coils | z gradient coils      |
|-------|------------------------|-----------------------|
| $a_L$ | 1                      | 1                     |
| $a_S$ | 0.03                   | 0.6                   |
| $a_E$ | $0.807 \times 10^{-8}$ | $2.75 \times 10^{-8}$ |

The foregoing discussion has focussed on the gradient coils for the x direction. It will be appreciated that he y-axis shield 30 and active 38 coils are substantially identical in construction to the corresponding x-axis coils, although they are rotated ninety degrees (90°) about the z-axis so as to provide a gradient in the y-direction.

Figure 7:
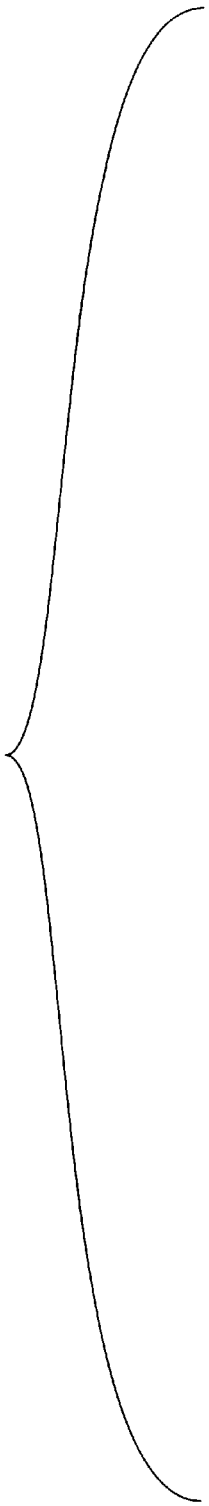
FIG. 7 is a side view which depicts the spacing between the layers of a gradient coil assembly.

FIG. 7 is a side view which depicts distance in millimeters between the various layers of the gradient assembly 6 associated with the upper pole piece and the center of the magnet, it being understood that these distances are also representative of the distances for the lower gradient assembly.

A particular advantage of the coil arrangement depicted in FIG. 7 is that the sensitivities of the various coil are approximately equal so that, for an equal drive current, each coil produces an approximately equal gradient field. For a given spacing between active and shield layers, the z-axis coils would have a sensitivity greater than those of the x-axis and y-axis coils. Hence, it is advantageous that the z-axis layers are disposed inside the x-axis and y-axis layers. In this way, the distance between the x-axis and y-axis is relatively greater than the distance between the z-axis layers. Similarly, the x-axis and y-axis coils are spaced equally so that each has a substantially equal efficiency.

A gradient coil system as described herein has been demonstrated to provide gradient fields in a system having a total gap between the pole of 500 mm and an imaging volume which is a sphere with radius 360 mm. The total diameter of the gradient set is 890 mm, and the thickness of each gradient assembly 6 is 50 mm. Other salient characteristics are listed below:

| Parameter | x and y coils | z coil |
| --- | --- | --- |
| Current @ 10 mT/M | 142.5 A | 119.2 A |
| Slew rate at 300 V (theoretical) | 25.4 T/m/S | 59.2 T/m/S |
| Stored energy @ 10 mT/m | 8.414 J | 3.018 J |
| Power @ 10 mT/m (theoretical) | 1.99 kW | 2.03 kW |
| Coil Resistance (theoretical) | 0.098 Ohms | 0.143 Ohms |
| Leakage flux density @ 10 mt/M | | |
| center of pole | <0.2 mT | <0.2 mT |
| edge of coil | <6.3 mT | <1.1 mT |
| Gradient linearity | | |
| in air | 4.98% | 4.85% |
| with iron | 5.3% | 5.3% |
| Number of turns | | |
| active layer | 44 | 35 |
| shield layer | 36 | 30 |

The invention has been described with reference to the preferred embodiment. Obviously, modifications and alterations will occur to others upon reading an understanding the preceding description. It is intended that the invention be construed as including all such modifications and alterations insofar as they come within the scope of the appended claims or the equivalents thereof.

What is claimed is:

1. An apparatus for use in magnetic resonance imaging comprising:
   a magnet which includes first and second pole pieces disposed on opposite sides of and generating a main magnetic field within an examination region;
   a generally planar first gradient coil for generating a first gradient magnetic field within the examination region, the first gradient coil disposed between the first pole piece and the examination region and having an outer perimeter, the first gradient coil including:
     first and second active layers; and
     a shield layer disposed between an active layer and the first pole piece, the active and shield layers being electrically connected at a plurality of locations along the outer perimeter of the gradient coil.

2. The apparatus of claim 1 wherein the active and shield layers are electrically connected so as to form a squirrel cage structure.

3. The apparatus of claim 2 wherein the first and second active layers are substantially mirror images of one another.

4. The apparatus of claim 3 wherein the shield layer includes first and second shield layers which are substantially mirror images of one another.

5. The apparatus of claim 1 wherein the first gradient coil generates a first gradient magnetic field in a direction orthogonal to the main magnetic field and wherein the apparatus further includes a generally planar second gradient coil for generating a second gradient magnetic field in a direction orthogonal to the main magnetic field, the second gradient coil disposed between the first pole piece and the examination region and having an outer perimeter, the second gradient coil including:
   first and second active layers; and
   a shield layer disposed between the active layers and the first pole piece, the active and shield layers being electrically connected at a plurality of locations along outer perimeter of the gradient coil.

6. The apparatus of claim 5 wherein the active layer of the second gradient coil is disposed between an active layer of the first gradient coil and the first pole piece.

7. The apparatus of claim 6 wherein the shield layer of the second gradient coil is disposed between the shield layer of the first gradient coil and the first pole piece.

8. The apparatus of claim 7 further including a third gradient coil for generating a third gradient magnetic field in a direction parallel to the main magnetic field, the third gradient coil being disposed between the active layer of the second gradient coil and the shield layer of the first gradient coil.

9. An apparatus for use in magnetic resonance imaging comprising:
   a magnet which includes first and second pole pieces disposed on opposite sides of and generating a main magnetic field within an examination region;
   a generally planar first gradient coil for generating a first gradient magnetic field within the examination region, the first gradient coil disposed between the first pole piece and the examination region and having an outer perimeter, the first gradient coil including:
     an active layer; and
     a shield layer disposed between the active layer and the first pole piece, the active and shield layers being electrically connected at a plurality of locations along the outer perimeter of the gradient coil, wherein the average current in the plane of the gradient coil along the outer perimeter of the gradient coil is substantially zero.

10. The apparatus of claim 9 wherein the active and shield layers each comprise a plurality of generally planar conductors, the conductors having slits extending therethrough, whereby eddy currents generated by magnetic flux having a component perpendicular to the plane of the gradient coil are reduced.

11. The apparatus of claim 9 wherein the active layer includes first and second active layers which are substantially mirror images of one another.

12. The apparatus of claim 11 wherein the shield layer includes first and second shield layers which are substantially mirror images of one another.

13. A magnetic resonance imaging apparatus comprising:
   a magnet which includes first and second pole pieces disposed on opposite sides of and generating a main magnetic field within an examination region;
   generally planar first, second, and third gradient coils for generating gradient magnetic fields in orthogonal directions, the first and second gradient coils each including
     an active layer disposed between the first pole piece and the examination region and having a first plurality of conductors; and a shield layer disposed between the first pole piece and the active layer and having a second plurality of conductors, each of the conductors in the shield layer being connected electrically in series with a conductor in the active layer such that an average current in the plane of the coil at the perimeter of the coil is substantially zero.

14. The apparatus of claim 13 wherein the shield layer of the second gradient coil, the shield layer of the first gradient coil, the active layer of the second gradient coil, and the active layer of the first gradient coil are disposed in sequence between the first pole piece and the examination region.

15. The apparatus of claim 14 wherein the third gradient coil is disposed between the shield layer of the first gradient coil and the active layer of the second gradient coil.

16. The apparatus of claim 13 wherein the electrical connections between the active and shield layers of the first gradient coil include electrical conductors located at the perimeter of the gradient coil.

17. The apparatus of claim 16 wherein the electrical conductors are parallel to the main magnetic field.

18. The apparatus of claim 16 wherein the electrical conductors include a first electrical conductor portion integral with an active layer conductor and a second electrical conductor portion integral with a shield layer conductor, the first and second conductor portions being electrically connected.

19. The apparatus of claim 13 wherein the spacing between the active and shield layers of the first gradient coil is equal to the spacing between the active and shield layers of the second gradient coil.

* * * * *

UNITED STATES PATENT AND TRADEMARK OFFICE
CERTIFICATE OF CORRECTION

PATENT NO. : 6,144,204

DATED : Nov. 7, 2000

INVENTOR(S) : Mikhail G. Sementchenko

It is certified that error appears in the above-identified patent and that said Letters Patent is hereby corrected as shown below:

In the title, please delete "Meeting" and insert therefor -- Imaging --.

Signed and Sealed this

Eighth Day of May, 2001

Attest:

NICHOLAS P. GODICI

Attesting Officer

Acting Director of the United States Patent and Trademark Office